United States Patent
Cheng et al.

(10) Patent No.: US 11,164,918 B2
(45) Date of Patent: Nov. 2, 2021

(54) ORGANIC LIGHT EMITTING DIODE DISPLAY PANEL HAVING CONNECTION PORTION CONNECTING ORGANIC LIGHT EMITTING DIODE TO PERIPHERAL CIRCUIT AND MANUFACTURING METHOD THEREOF

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 335 days.

(21) Appl. No.: 16/324,493

(22) PCT Filed: May 14, 2018

(86) PCT No.: PCT/CN2018/086653
§ 371 (c)(1),
(2) Date: Feb. 8, 2019

(87) PCT Pub. No.: WO2019/029208
PCT Pub. Date: Feb. 14, 2019

(65) Prior Publication Data
US 2021/0159287 A1   May 27, 2021

(30) Foreign Application Priority Data

Aug. 8, 2017   (CN) .......................... 201710674200.9

(51) Int. Cl.
| H01L 27/32 | (2006.01) |
| H01L 51/56 | (2006.01) |
| H01L 51/52 | (2006.01) |

(52) U.S. Cl.
CPC ........ *H01L 27/3244* (2013.01); *H01L 51/525* (2013.01); *H01L 51/5228* (2013.01); *H01L 51/56* (2013.01); *H01L 2227/323* (2013.01)

(58) Field of Classification Search
CPC ............. H01L 27/3244; H01L 51/5228; H01L 51/525; H01L 51/56
See application file for complete search history.

(56) References Cited

U.S. PATENT DOCUMENTS

| 2007/0108899 A1 | 5/2007 | Jung et al. |
| 2012/0025700 A1* | 2/2012 | Ryu .................... H01L 27/3276 313/512 |

(Continued)

FOREIGN PATENT DOCUMENTS

| CN | 203217211 U | 9/2013 |
| CN | 105845712 A | 8/2016 |
| CN | 107302016 A | 10/2017 |

OTHER PUBLICATIONS

International Search Report and Written Opinion dated Aug. 17, 2018, from application No. PCT/CN2018/086653.

*Primary Examiner* — Michael Jung
(74) *Attorney, Agent, or Firm* — Arch & Lake LLP

(57) ABSTRACT

An organic light emitting diode display panel is disclosed. The organic light emitting diode display panel includes a first substrate and a second substrate disposed opposite to each other. The first substrate includes a first lead connected to a cathode. The second substrate includes a second lead connected to a peripheral circuit. The first lead is connected to the second lead through a connection portion.

13 Claims, 7 Drawing Sheets

(56) References Cited

U.S. PATENT DOCUMENTS

| | | | |
|---|---|---|---|
| 2012/0026074 A1* | 2/2012 | Lee | H01L 51/5237 |
| | | | 345/76 |
| 2012/0097987 A1* | 4/2012 | Ryu | H01L 51/524 |
| | | | 257/88 |
| 2012/0146487 A1* | 6/2012 | Kim | H01L 51/5259 |
| | | | 313/504 |
| 2012/0153814 A1* | 6/2012 | Lee | H01L 27/3276 |
| | | | 313/504 |
| 2016/0035761 A1* | 2/2016 | Kwon | H01L 27/2418 |
| | | | 257/72 |
| 2016/0172425 A1* | 6/2016 | Lee | H01L 51/5228 |
| | | | 257/40 |

* cited by examiner

ORGANIC LIGHT EMITTING DIODE DISPLAY PANEL HAVING CONNECTION PORTION CONNECTING ORGANIC LIGHT EMITTING DIODE TO PERIPHERAL CIRCUIT AND MANUFACTURING METHOD THEREOF

CROSS REFERENCE

The present application is based International Application No. PCT/CN2018/086653, filed on May 14, 2018 which is based upon and claims priority of Chinese patent application No. 201710674200.9, filed on Aug. 8, 2017 and entitled as "organic light emitting diode display panel and manufacturing method thereof," the entire disclosure of which is hereby incorporated by reference.

TECHNICAL FIELD

The present disclosure relates to the technical field of displays, and in particular, to an organic light emitting diode display panel and a manufacturing method thereof.

BACKGROUND

An organic light-emitting diode (OLED) display device has characteristics of a self-luminous feature, a fast response, a wide viewing angle, a high brightness, bright colors, a light and thin body, compared to a liquid crystal display device, and is considered as a next-generation display technology.

The existing OLED display panel includes a substrate, a thin film transistor disposed on the substrate, a pixel definition layer and an OLED device layer, wherein a cathode in an OLED device layer is connected to a printed circuit board by a lead passing through a via hole penetrating a plurality of layers. Since the via holes are relatively deep, the lead for connecting the cathode and the printed circuit board may be easily broken, resulting in poor contact between the cathode and the printed circuit board, thus causing poor display effect for the OLED display panel.

SUMMARY

The present disclosure provides an organic light emitting diode display panel and a manufacturing method thereof. An aspect of the present disclosure provides an organic light emitting diode display panel. The organic light emitting diode display panel includes a first substrate and a second substrate disposed opposite to each other. The first substrate includes a first lead connected to a cathode. The second substrate includes a second lead connected to a peripheral circuit. The first lead is connected to the second lead through a connection portion.

In some arrangements, the first substrate further includes an extension portion extending to a non-display area. The cathode is connected to the first lead through the extension portion.

In some arrangements, the first lead is disposed on a side of a planarization layer adjacent to the second substrate.

In some arrangements, the first lead is disposed on a side of an interlayer insulating layer adjacent to the second substrate.

In some arrangements, the extension portion is in a stepped shape. In some arrangements, the connection portion includes. a first spacer that is electrically conductive. The first spacer is disposed between the first lead and the second lead.

In some arrangements, the connection portion includes a second spacer and an auxiliary electrode. The second spacer is disposed on a side of the first lead adjacent to the second substrate, and the auxiliary electrode is disposed between the second spacer and the first lead and covers the second spacer and the second lead.

In some arrangements, the second substrate further includes a third spacer that is electrically conductive. The third spacer is connected to the extension portion. The third spacer is disposed between the second lead and the extension portion.

In some arrangements, the second substrate further includes a fourth spacer. The fourth spacer is connected to the extension portion by the auxiliary electrode. The fourth spacer is disposed between the second lead and the auxiliary electrode.

Another aspect of the present disclosure provides a method for manufacturing an OLED display panel. The OLED display panel includes a first substrate and a second substrate disposed opposite to each other. The method includes providing on the first substrate a first lead connected to a cathode. The method includes providing on the second substrate a second lead connected to a peripheral circuit. The method includes providing a connection portion on the first substrate or the second substrate, the connection portion for connecting the first lead and the second lead. The method includes encapsulating the first substrate and the second substrate to form a cell.

In some arrangements, providing on the first substrate a first lead connected to a cathode includes providing a planarization layer on the base. The first lead is disposed on a side of the planarization layer adjacent to the second substrate.

In some arrangements, providing on the first substrate a first lead connected to a cathode includes providing an interlayer insulating layer on the base. The first lead is disposed on a side of the interlayer insulating layer adjacent to the second substrate.

In some arrangements, the connection portion includes a first spacer that is electrically conductive. Providing a connection portion on the first substrate includes providing the first spacer on a side of the first lead adjacent to the second substrate or providing a connection portion on the second substrate includes providing the first spacer on a side of the second lead adjacent to the first substrate.

In some arrangements, the connection portion includes a second spacer and an auxiliary electrode. Providing a connection portion on the second substrate includes providing a second spacer on a side of the second lead adjacent to the first substrate, and providing an auxiliary electrode on a side of the second spacer adjacent to the first substrate. The auxiliary electrode covers the second lead.

In some arrangements, when the first spacer is provided, the method further includes providing the third spacer on the first substrate or on the second substrate for connecting the extension portion and the second lead.

In some arrangements, when the second spacer is provided, the method further includes providing a fourth spacer on the second substrate, and the auxiliary electrode further covers the fourth spacer.

In some arrangements, the cathode is connected to the first lead by an extension portion extending to a non-display area. The extension portion is in a stepped shape.

BRIEF DESCRIPTION OF THE DRAWINGS

The accompanying drawings are intended to provide a further understanding of the technical solutions of the present disclosure, constitute a part of the specification, serve to explain the technical solutions of the present disclosure together with the arrangements of the present application, and do not constitute a limitation of the technical solutions of the present disclosure.

DETAILED DESCRIPTION

Figure 1:
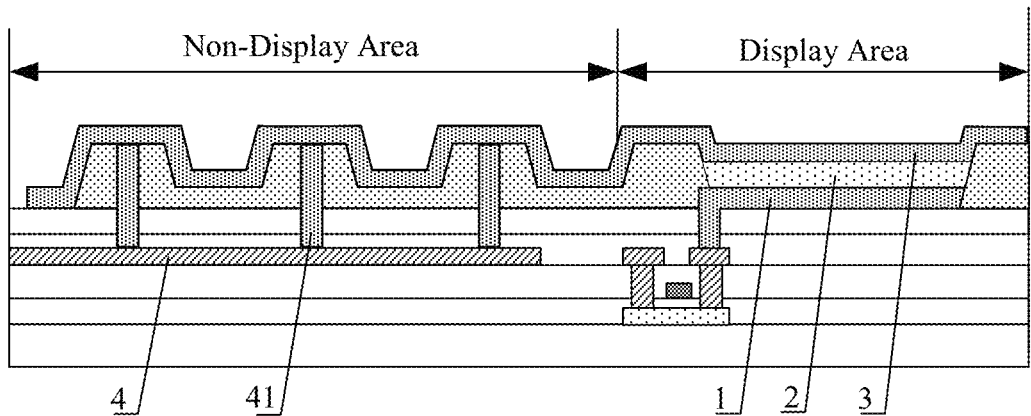
FIG. 1 is a schematic structural diagram of an OLED display panel in the prior art.

In order to illustrate the objects, technical solutions and improvements of the present disclosure, the arrangements of the present disclosure will be described in detail below with reference to the accompanying drawings. It should be noted that, in the case of no conflict, the features in the arrangements and the arrangements in the present application may be combined with each other in any manner.

For the sake of clarity, the thickness and size of the layers or microstructures may be exaggerated in the drawings for illustrating the arrangements of the present disclosure. It will be understood that when an element such as a layer, a film, an area or a substrate is referred to as being "on" or "under" another element, the element may be "directly" "on" or "under" another element, or there may an intermediate element.

FIG. 1. is a schematic structural diagram of an OLED display panel in the related art. As shown in FIG. 1, the OLED display panel includes: a thin film transistor disposed on a substrate, a pixel definition layer, and an OLED device layer. The OLED device layer is mainly composed of an anode 1, a light emitting layer 2 and a cathode 3. The cathode 3 in the OLED device layer has to extend to an extension portion of a non-display area and is connected to a printed circuit board by a lead 4. As shown in FIG. 1, in the existing OLED display panel, a via hole 41 is provided in the Pixel Definition Layer (PDL) in the non-display area, and the via hole 41 is directly extended to a source-drain electrode layer of the thin film transistor, and the cathode is led out of the printed circuit board with the metal of the source-drain electrode. However, in such configuration, the via hole 41 has to penetrate a plurality of layers, and the via hole 41 has a large depth, such that the lead passing through the via hole 41 to connect the cathode and the printed circuit board may be easily broken, resulting in poor contact between the cathode and the printed circuit board, thus causing poor display effect for the OLED display panel.

Figure 2:
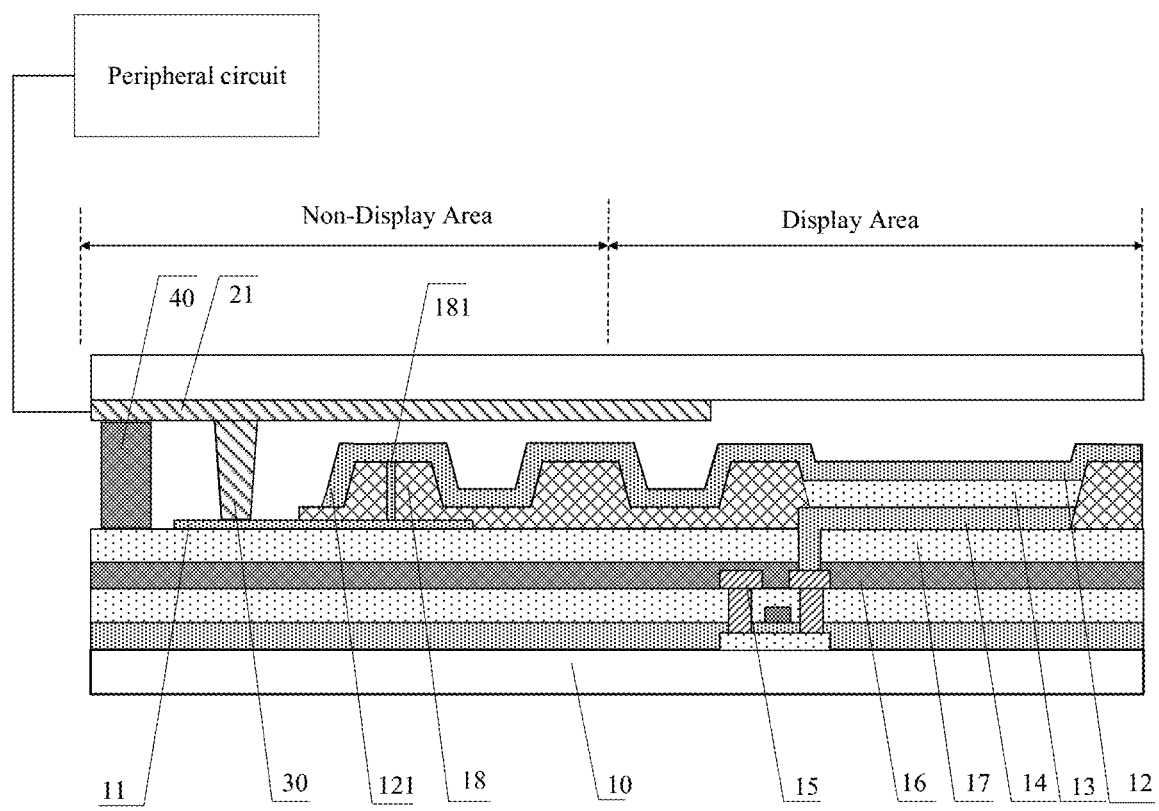
FIG. 2 is a schematic structural diagram of an OLED display panel according to some arrangements of the present disclosure.

FIG. 2 is a schematic structural diagram of an OLED display panel provided in some arrangements of the present disclosure. As shown in FIG. 2, an OLED display panel provided in some arrangements of the present disclosure includes a first substrate and a second substrate disposed opposite to each other. The first substrate includes a first lead 11 connected to a cathode 12. The second substrate includes a second lead 21 connected to a peripheral circuit. The first lead 11 is connected to the second lead 21 by a connection portion.

In some arrangements of the present disclosure, the first substrate is an array substrate, and the second substrate is a color film substrate. It is to be understood that the first substrate includes a base 10, and the base 10 includes a display area and a non-display area surrounding the display area. The first substrate further includes: a thin film transistor 15 disposed on the base 10 in the display area, a passivation layer 16 and a planarization layer 17 disposed on the base and covering the entire base, a pixel definition layer 18 disposed on the planarization layer 17 and an OLED device layer disposed on the base 10 of the display area. The OLED device layer includes an anode 14, a light emitting layer 13 and a cathode 12.

It should be noted that the thin film transistor 15 may be a top gate structure or a bottom gate structure, and FIG. 2 will be described taking the thin film transistor of a bottom gate structure as an example.

The first substrate may further include an extension portion 121 extending to the non-display area, and the cathode 12 is connected to the first lead 11 through the extension portion 121.

The extension portion 121 and the cathode 12 have the same material and the same thickness, and the extension portion 121 may be connected to the first lead 11 in a direct contacting manner. That is, the extension portion directly contacts the first lead. Optionally, the first lead and the cathode may be connected by a lead through a via hole 181 provided in the pixel definition layer. FIG. 2 will be described taking the cathode connecting to the first lead through a via hole 181 as an example, and the present disclosure is not limited thereto.

In some arrangements of the present disclosure, the first lead 11 is disposed on a side of the planarization layer 17 adjacent to the second substrate. It should be noted that the first lead 11 is disposed on the planarization layer 17 in the non-display area. In order to simplify the process, the material of the first lead 11 is the same as that of the anode 14.

In addition, it should be noted that, in order to ensure that the first lead 11 can be connected to the second lead 21 through the connection portion, in some arrangements of the present disclosure, an orthographic projection of the extension portion 121 on the base 10 does not completely cover an orthographic projection of the first lead 11 on the base.

In some arrangements of the present disclosure, the connection portion includes a first spacer 30 that is electrically conductive. The first spacer 30 is disposed on a side of the first lead 11 adjacent to the second substrate, and the first spacer 30 is disposed between the first lead 11 and the second lead 21.

The connection portion may be disposed on the first substrate, or may be disposed on the second substrate, depending on actual needs, and the present disclosure is not limited thereto.

There is a gap between the orthographic projection of the first spacer 30 on the base 10 and the orthographic projection of the extension portion 121 on the base 10. It should be noted that in some arrangements of the present disclosure, the first spacer 30 can not only separate the first substrate and the second substrate, but also function to connect the first lead 11 and the second lead 21.

Optionally, the material of the first spacer 30 may be an alloy of one or more of chromium Cr, silver Ag, magnesium Mg, molybdenum Mo, aluminum Al, copper Cu, or doped with a polymer of the above metal particles or alloy particles, to which the present disclosure does not limit.

Optionally, the shape of the first spacer 30 may be rectangular, trapezoidal or of other shapes. FIG. 2 is an example in which the first spacer 30 is trapezoidal, and the present disclosure is not limited thereto.

In addition, the OLED display panel provided by the arrangement of the present disclosure further includes: sealant 40 disposed between the first substrate and the second substrate. The sealant 40 is configured to connect the first substrate and the second substrate.

The arrangement of the present disclosure provides an OLED display panel, and the OLED display panel includes: a first substrate and a second substrate disposed opposite to each other. The first substrate includes a first lead connected to the cathode. The second substrate includes a second lead connected to a peripheral circuit. The first lead is connected to the second lead through the connection portion. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

Figure 3:
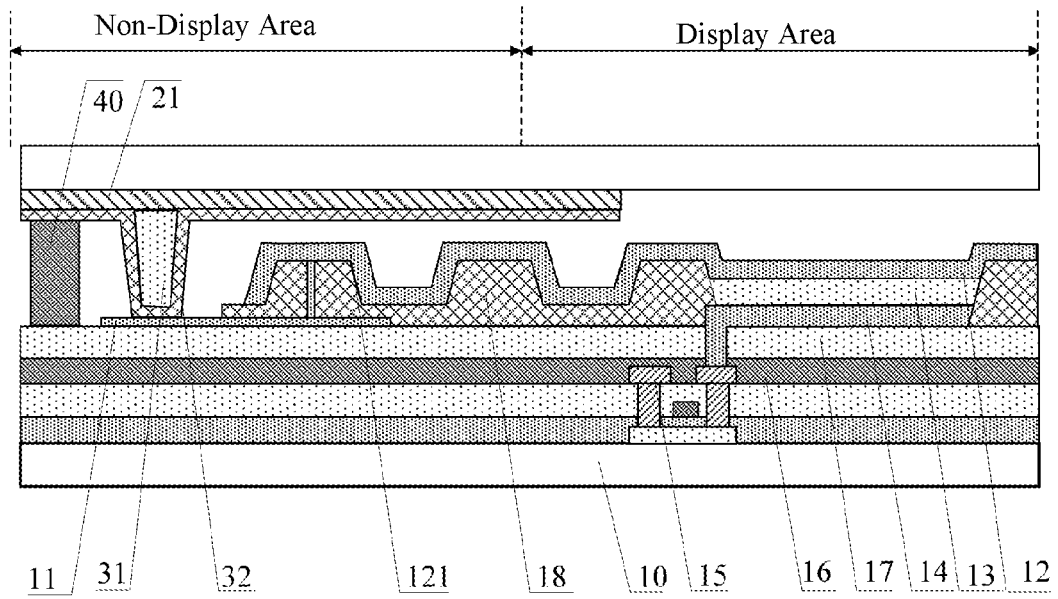
FIG. 3 is a schematic structural diagram of an OLED display panel according to some arrangements of the present disclosure.

Based on the above inventive concept, FIG. 3 is a schematic structural diagram of an OLED display panel provided in some arrangements of the present disclosure. As shown in FIG. 3, an OLED display panel provided in the arrangement of the present disclosure includes a first substrate and a second substrate disposed opposite to each other. The first substrate includes a first lead 11 connected to a cathode 12. The second substrate includes a second lead 21 connected to a peripheral circuit. The first lead 11 is connected to the second lead 21 by a connection portion.

In some arrangements of the present disclosure, the first substrate is an array substrate, and the second substrate is a color film substrate. It is to be understood that the first substrate includes a base 10, and the base 10 includes a display area and a non-display area surrounding the display area. The first substrate further includes: a thin film transistor 15 disposed on the base 10 in the display area, a passivation layer 16 and a planarization layer 17 disposed on the base and covering the entire base, a pixel definition layer 18 disposed on the planarization layer 17 and an OLED device layer disposed on the base 10 of the display area. The OLED device layer includes an anode 14, a light emitting layer 13 and a cathode 12.

It should be noted that the thin film transistor 15 may be a top gate structure or a bottom gate structure, and FIG. 3 will be described taking the thin film transistor of a bottom gate structure as an example.

The first substrate may further include an extension portion 121 extending to the non-display area, and the cathode 12 is connected to the first lead 11 through the extension portion 121.

The extension portion 121 and the cathode 12 have the same material and the same thickness, and the extension portion 121 may be connected to the first lead 11 in a direct contacting manner. That is, the extension portion directly contacts the first lead. Optionally, the first lead and the cathode may be connected by a lead through a via hole (as shown in FIG. 2) provided in the pixel definition layer. FIG. 3 will be described taking the cathode connecting to the first lead. through a via hole (as shown in FIG. 2) as an example, and the present disclosure is not limited thereto.

In some arrangements of the present disclosure, the first lead 11 is disposed on a side of the planarization layer 17 adjacent to the second substrate. It should be noted that the first lead 11 is disposed on the planarization layer 17 in the non-display area. In order to simplify the process, the material of the first lead 11 is the same as that of the anode 14.

In addition, it should be noted that, in order to ensure that the first lead can be connected to the second lead through the connection portion, in some arrangements of the present disclosure, an orthographic projection of the extension portion 121 on the base 10 does not completely cover an orthographic projection of the first lead 11 on the base.

In some arrangements of the present disclosure, the connection portion includes: a second spacer 31 and an auxiliary electrode 32. The second spacer 31 is disposed on a side of the first lead 11 adjacent to the second substrate, and the auxiliary electrode 32 is disposed at a side of the second spacer 31 away from the second lead 21, that is, disposed between the second spacer 31 and the first lead 11 and covering the second spacer 31 and the second lead 21.

In some arrangements of the present disclosure, the connection portion is disposed on the second substrate.

There is a gap between an orthographic projection of the second spacer 31 on the base 10 and an orthographic projection of the extension portion 121 on the base 10. It should be noted that in some arrangements of the present disclosure, the second spacer 31 can separate the first substrate and the second substrate, and the auxiliary electrode 32 can function to connect the first lead 11 and the second lead 21.

Optionally, the material of the second spacer 31 may be silicon oxide, silicon nitride, or a polymer including silicon oxide or silicon nitride, and the like, and the material of the second spacer is not specifically limited.

Optionally, the shape of the second spacers 31 may be rectangular, trapezoidal or of other shapes. FIG. 3 is an example in which the second spacer 31 is trapezoidal, and the present disclosure is not limited thereto.

Optionally, the material of the auxiliary electrode 32 may be an alloy of one or more of chromium Cr, silver Ag, magnesium Mg, molybdenum Mo, aluminum Al, copper Cu, or doped with a polymer of the above metal particles or alloy particles, or a transparent conductive material, such as indium tin oxide, which is not limited in the present disclosure.

In addition, the OLED display panel provided by the arrangement of the present disclosure further includes: sealant 40 disposed between the first substrate and the second substrate. The sealant 40 is configured to connect the first substrate and the second substrate.

The arrangement of the present disclosure provides an OLED display panel, and the OLED display panel includes: a first substrate and a second substrate disposed opposite to each other. The first substrate includes a first lead connected to the cathode. The second substrate includes a second lead connected to a peripheral circuit. The first lead is connected to the second lead through the connection portion. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

Figure 4:
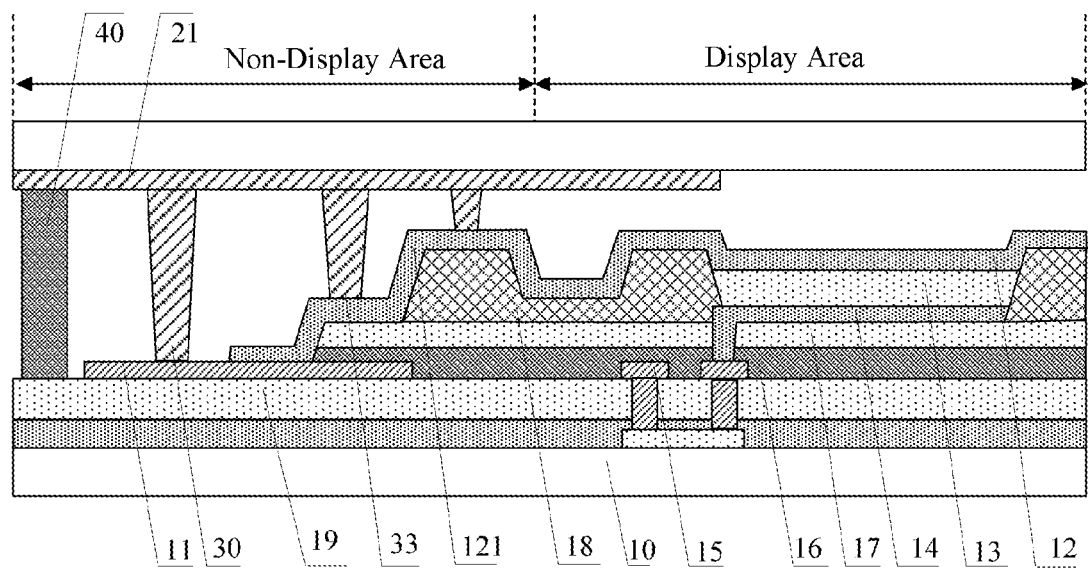
FIG. 4 is a schematic structural diagram of an OLED display panel according to some arrangements of the present disclosure.

Based on the above inventive concept, FIG. 4 is a schematic structural diagram of an OLED display panel provided in some arrangements of the present disclosure. As shown in FIG. 4, an OLED display panel provided in the arrangement of the present disclosure includes a first substrate and a second substrate disposed opposite to each other. The first substrate includes a first lead 11 connected to a cathode 12. The second substrate includes a second lead 21 connected to a peripheral circuit. The first lead 11 is connected to the second lead 21 by a connection portion.

In some arrangements of the present disclosure, the first substrate is an array substrate, and the second substrate is a color film substrate. It is to be understood that the first substrate includes a base 10, and the base 10 includes a display area and a non-display area surrounding the display area. The first substrate further includes: a thin film transistor 15 disposed on the base 10 in the display area, a passivation layer 16 and a planarization layer 17 disposed on the base and covering the entire base, a pixel definition layer 18 disposed on the planarization layer 17 and an OLED device layer disposed on the base 10 of the display area. The OLED device layer includes an anode 14, a light emitting layer 13 and a cathode 12.

It should be noted that the thin film transistor 15 may be a top gate structure or a bottom gate structure, and FIG. 4 will be described taking the thin film transistor of a bottom gate structure as an example.

The first substrate may further include an extension portion 121 extending to the non-display area, and the cathode 12 is connected to the first lead 11 through the extension portion 121.

The extension portion 121 and the cathode 12 have the same material and the same thickness, and the extension portion 121 may be connected to the first lead 11 in a direct contacting manner.

In some arrangements of the present disclosure, the first lead 11 is disposed on a side of the second substrate adjacent to an interlayer insulation layer 19. It should be noted that the first lead 11 is disposed on the interlayer insulation layer 19 in the non-display area. In order to simplify the process, the material of the first lead 11 is the same as that of the source-drain electrode.

In addition, it should be noted that, in order to ensure that the first lead 11 can be connected to the second lead 12 through the connection portion, in some arrangements of the present disclosure, an orthographic projection of the extension portion 121 on the base 10 does not completely cover an orthographic projection of the first lead 11 on the base.

Moreover, in order to avoid providing a via hole on the first substrate, the extension portion 121 may be in a stepped shape and is connected to the first lead 11. In this case, an orthographic projection of the passivation layer 16 on the base 10 is smaller than the base 10, an orthographic projection of the planarization layer 17 on the base 10 is smaller than the base 10, and the orthographic projection of the passivation layer 16 on the base 10 is larger than the orthographic projection of the planarization layer 17 on the base 10. That is, the planarization layer 17, the passivation layer 16 and the base 10 form a stepped shape.

In some arrangements of the present disclosure, the connection portion includes a first spacer 30 that is electrically conductive. The first spacer 30 is disposed on a side of the first lead 11 adjacent to the second substrate, and the first spacer 30 is disposed between the first lead 11 and the second lead 21.

The connection portion may be disposed on the first substrate, or may be disposed on the second substrate, depending on actual needs, and the present disclosure is not limited thereto.

There is a gap between the orthographic projection of the first spacer 30 on the base 10 and the orthographic projection of the extension portion 121 on the base 10. It should be noted that in some arrangements of the present disclosure, the first spacer 30 can not only separate the first substrate and the second substrate, but also function to connect the first lead 11 and the second lead 21.

Optionally, the material of the first spacer 30 may be an alloy of one or more of chromium Cr, silver Ag, magnesium Mg, molybdenum Mo, aluminum Al, copper Cu, or doped with a polymer of the above metal particles or alloy particles, to which the present disclosure does not limit.

Optionally, the shape of the first spacer 30 may be rectangular, trapezoidal or of other shapes. FIG. 4 is an example in which the first spacer 30 is trapezoidal, and the present disclosure is not limited thereto.

In order to avoid failure of desired contact between the cathode and the peripheral circuit due to failure of the first lead or the first spacer. In some arrangements of the present disclosure, the connection portion includes a third spacer 33 that is electrically conductive, the third spacer 33 is connected to the extension portion 121 for connecting the cathode 12 and the second lead 21, and the third spacer 33 is disposed on a side of the second lead 21 adjacent to the first substrate. The third spacer 33 may be disposed between the second lead 21 and the extension portion 121.

It should be noted that the first spacers 30 is connected to the first lead 11 and the second lead 21, and the third spacer 33 is connected to the extension portion and the second lead 21. That is, the first spacer is disposed at a position corresponding to the first lead, rather than corresponding to the extension portion. The third spacer is disposed at a position corresponding to the extension portion, and the third spacer 33 is disposed in parallel with the first spacer 30. The number of the third spacers 33 may be in plural, and FIG. 4 illustrates an example in which there are 2 third spacers 33. However, the present disclosure is not limited thereto.

Optionally, the material of the third spacer 33 may be an alloy of one or more of chromium Cr, silver Ag, magnesium Mg, molybdenum Mo, aluminum Al, copper Cu, or doped with a polymer of the above metal particles or alloy particles, to which the present disclosure does not limit. It should be noted that the materials of the first spacer and the third spacer may be the same or different.

Optionally, the shape of the third spacer 33 may be rectangular, trapezoidal or of other shapes. FIG. 4 is an example in which the third spacer 33 is trapezoidal, and the present disclosure is not limited thereto. It should be noted that the shapes of the first spacer and the third spacer may be the same or different, to which the present disclosure does not limit.

In addition, the OLED display panel provided by the arrangement of the present disclosure further includes: sealant 40 disposed between the first substrate and the second substrate. The sealant 40 is configured to connect the first substrate and the second substrate.

The arrangement of the present disclosure provides an OLED display panel, and the OLED display panel includes: a first substrate and a second substrate disposed opposite to each other. The first substrate includes a first lead connected to the cathode. The second substrate includes a second lead connected to a peripheral circuit. The first lead is connected to the second lead through the connection portion. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

Figure 5:
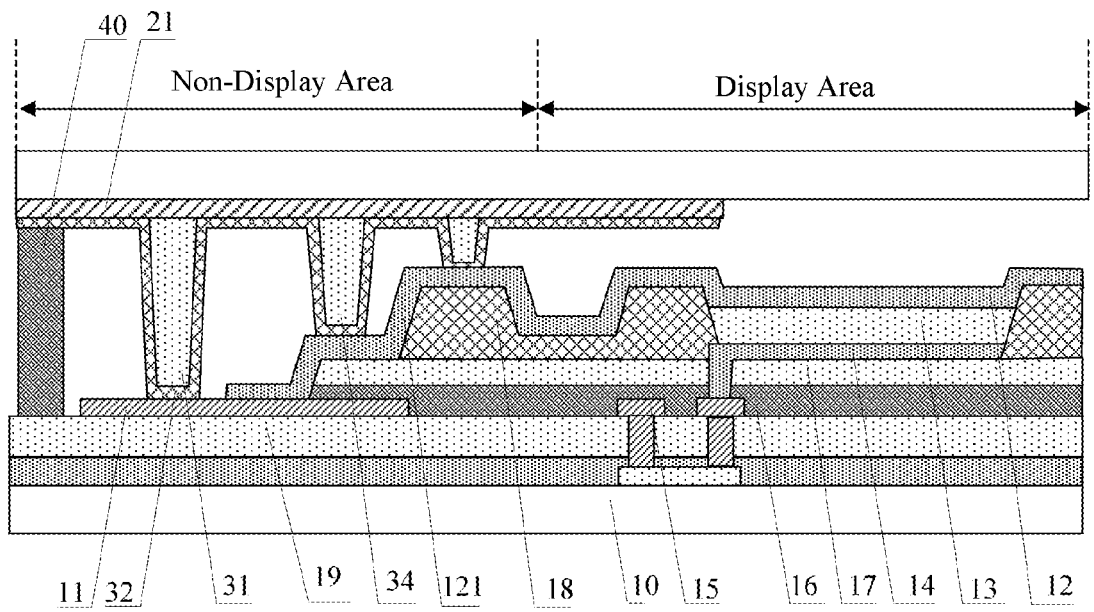
FIG. 5 is a schematic structural diagram of an OLED display panel according to some arrangements of the present disclosure.

Based on the above inventive concept, FIG. 5 is a schematic structural diagram of an OLED display panel provided in some arrangements of the present disclosure. As shown in FIG. 5, an OLED display panel provided in the arrangement of the present disclosure includes a first substrate and a second substrate disposed opposite to each other. The first substrate includes a first lead 11 connected to a cathode 12. The second substrate includes a second lead 21 connected to a peripheral circuit. The first lead 11 is connected to the second lead 21 by a connection portion.

In some arrangements of the present disclosure, the first substrate is an array substrate, and the second substrate is a color film substrate. It is to be understood that the first substrate includes a base 10, and the base 10 includes a display area and a non-display area surrounding the display area. The first substrate further includes: a thin film transistor 15 disposed on the base 10 in the display area, a passivation layer 16 and a planarization layer 17 disposed on the base and covering the entire base, a pixel definition layer 18 disposed on the planarization layer 17 and an OLED device layer disposed on the base 10 of the display area. The OLED device layer includes an anode 14, a light emitting layer 13 and a cathode 12.

It should be noted that the thin film transistor 15 may be a top gate structure or a bottom gate structure, and FIG. 5 will be described taking the thin film transistor of a bottom gate structure as an example.

The first substrate may further include an extension portion 121 extending to the non-display area, and the cathode 12 is connected to the first lead 11 through the extension portion 121.

The extension portion 121 and the cathode 12 have the same material and the same thickness, and the extension portion 121 may be connected to the first lead 11 in a direct contacting manner.

In some arrangements of the present disclosure, the first lead 11 is disposed on a side of the second substrate adjacent to an interlayer insulation layer 19. It should be noted that the first lead 11 is disposed on the interlayer insulation layer 19 in the non-display area. In order to simplify the process, the material of the first lead 11 is the same as that of the source-drain electrode.

In addition, it should be noted that, in order to ensure that the first lead 11 can be connected to the second lead 12 through the connection portion, in some arrangements of the present disclosure, an orthographic projection of the extension portion 121 on the base 10 does not completely cover an orthographic projection of the first lead 11 on the base.

Moreover, in order to avoid providing a via hole on the first substrate, the extension portion 121 may be in a stepped shape and is connected to the first lead 11. In this case, an orthographic projection of the passivation layer 16 on the base 10 is smaller than the base 10, an orthographic projection of the planarization layer 17 on the base 10 is smaller than the base 10, and the orthographic projection of the passivation layer 16 on the base 10 is larger than the orthographic projection of the planarization layer 17 on the base 10.

In some arrangements of the present disclosure, the connection portion includes: a second spacer 31 and an auxiliary electrode 32. The second spacer 31 is disposed on a side of the first lead 11 adjacent to the second substrate, and the auxiliary electrode 32 is disposed at a side of the second spacer 31 away from the second lead 21. The second spacer 31 may be disposed between the first lead 11 and the auxiliary electrode 32, and the auxiliary electrode 32 may be disposed between the second spacer 31 and the first lead 11 and covering the second spacer 31 and the second lead 21.

In some arrangements of the present disclosure, the connection portion is disposed on the second substrate.

There is a gap between an orthographic projection of the second spacer 31 on the base 10 and an orthographic projection of the extension portion 121 on the base 10. It should be noted that in some arrangements of the present disclosure, the second spacer 31 can separate the first substrate and the second substrate, and the auxiliary electrode 32 can function to connect the first lead 11 and the second lead 21.

Optionally, the material of the second spacer 31 may be silicon oxide, silicon nitride, or a polymer including silicon oxide or silicon nitride, and the like, and the material of the second spacer is not specifically limited.

Optionally, the shape of the second spacers 31 may be rectangular, trapezoidal or of other shapes. FIG. 5 is an example in which the second spacer 31 is trapezoidal, and the present disclosure is not limited thereto.

Optionally, the material of the auxiliary electrode 32 may be an alloy of one or more of chromium Cr, silver Ag, magnesium Mg, molybdenum Mo, aluminum Al, copper Cu, or doped with a polymer of the above metal particles or alloy particles, or a transparent conductive material, such as indium tin oxide, which is not limited in the present disclosure.

In order to avoid failure of desired contact between the cathode and the peripheral circuit due to failure of the first lead. In some arrangements of the present disclosure, the connection portion further includes a fourth spacer 34, the fourth spacer 34 is connected to the extension portion 121 through the auxiliary electrode 32, for connecting the cathode 12 and the second lead 21. The fourth spacer 34 is disposed on a side of the second lead 21 adjacent to the first substrate. The fourth spacer 34 is disposed between the second lead 21 and the auxiliary electrode 32. The auxiliary electrode 32 is disposed between the fourth spacer 34 and the extension portion 121, to further ensure the proper connection between the cathode and the peripheral circuit and realize excellent display effect of the OLED display panel.

It should be noted that the second spacers 31 is disposed at a position corresponding to the first lead 11, rather than corresponding to the extension portion 121. The fourth spacer is disposed at a position corresponding to the extension portion, and the fourth spacer 34 is disposed in parallel with the second spacer 31. The number of the fourth spacers 34 may be in plural, and FIG. 5 illustrates an example in which there are 2 fourth spacers 34. However, the present disclosure is not limited thereto.

Optionally, the material of the fourth spacers 34 may be silicon oxide, silicon nitride or a polymer including silicon oxide or silicon nitride, and the materials of the second spacer 31 and the fourth spacer 34 may be the same or different. However, the present disclosure is not limited thereto.

Optionally, the shape of the fourth spacer 34 may be rectangular, trapezoidal or of other shapes. FIG. 5 is an example in which the fourth spacer 34 is trapezoidal, and the present disclosure is not limited thereto. It should be noted that the shapes of the second spacer and the fourth spacer may be the same or different, and the present disclosure does not limit this.

In addition, the OLED display panel provided by the arrangement of the present disclosure further includes: sealant 40 disposed between the first substrate and the second substrate. The sealant 40 is configured to connect the first substrate and the second substrate.

The arrangement of the present disclosure provides an OLED display panel, and the OLED display panel includes: a first substrate and a second substrate disposed opposite to each other. The first substrate includes a first lead connected to the cathode. The second substrate includes a second lead connected to a peripheral circuit. The first lead is connected to the second lead through the connection portion. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

Based on the inventive concept of the above arrangements, some arrangements of the present disclosure provide a method for manufacturing an OLED display panel, and the OLED display panel includes: a first substrate and a second substrate disposed opposite to each other. The method may include the following.

In 100, a first lead connected to a cathode is disposed on the first substrate.

The first substrate is an array substrate. It is to be understood that the first substrate includes a base, and the base includes a display area and a non-display area surrounding the display area. The first substrate further includes: a thin film transistor disposed on the base in the display area, a passivation layer and a planarization layer disposed on the base and covering the entire base, a pixel definition layer disposed on the planarization layer and an OLED device layer disposed on the base of the display area. The OLED device layer includes an anode, a light emitting layer and a cathode.

100 may include the following.

In 110, a planarization layer is provided on the base.

The 110 includes: forming a thin film transistor on the base; forming a passivation layer on the thin film transistor, the passivation layer covering the entire base, and forming a planarization layer on the passivation layer, the planarization layer covering the entire base.

In 120, a first lead is disposed on a side of the planarization layer adjacent to the second substrate.

The first lead may be disposed on the planarization layer located in the non-display area. It should be noted that, in order to simplify the process, the first lead and the anode are made of the same material by the same process.

In 200, a second lead connected to a peripheral circuit is provided on the second substrate.

The second substrate is a color film substrate.

In 300, a connection portion is provided on the first substrate or the second substrate, and the connection portion is configured to connect the first lead and the second lead.

In some arrangements of the present disclosure, the connection portion includes a first spacer that is electrically conductive.

Providing the connection portion on the first substrate includes: providing a first spacer on a side of the first lead adjacent to the second substrate.

Optionally, providing the connection portion on the second substrate includes: providing a first spacer on a side of the second lead adjacent to the first substrate.

It should be noted that in some arrangements of the present disclosure, the first spacer can not only separate the first substrate and the second substrate, but also function to connect the first lead and the second lead.

Optionally, the material of the first spacer may be an alloy of one or more of chromium Cr, silver Ag, magnesium Mg, molybdenum Mo, aluminum Al, copper Cu, or doped with a polymer of the above metal particles or alloy particles, which is not limited in the present disclosure.

Optionally, the shape of the first spacer may be rectangular, trapezoidal or of other shapes, and the present disclosure is not limited thereto.

In 400, the first substrate and the second substrate are encapsulated to form a cell.

The first substrate and the second substrate are encapsulated with sealant to form a liquid crystal cell.

The arrangement of the present disclosure provides a method for manufacturing an OLED display panel, the OLED display panel includes: a first substrate and a second substrate disposed opposite to each other, and the method includes: providing a first lead connected to a cathode on the first substrate; providing a second lead connected to a peripheral circuit on the second substrate; providing a connection portion on the first substrate or the second substrate. The connection portion is configured to connect the first lead and the second lead; and encapsulating the first substrate and the second substrate to form a cell. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

The method for manufacturing an OLED display panel according to an arrangement of the present disclosure is further described below with reference to FIG. 6A to FIG. 6D, which is described as follows.

Figure 6A:
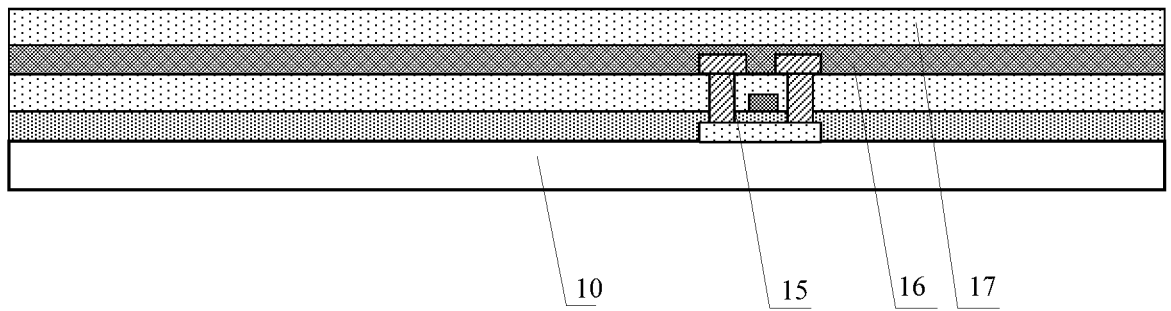
FIG. 6A is a first schematic diagram of a method for manufacturing an OLED display panel according to some arrangements of the present disclosure.

In 101, a thin film transistor 15, a passivation layer 16, and a planarization layer 17 are formed sequentially on the base 10, as shown in FIG. 6A.

The thin film transistor 15 may be a bottom gate structure disposed on the base 10 in the display area, and the passivation layer 16 and the planarization layer 17 cover the entire base 10.

Figure 6B:
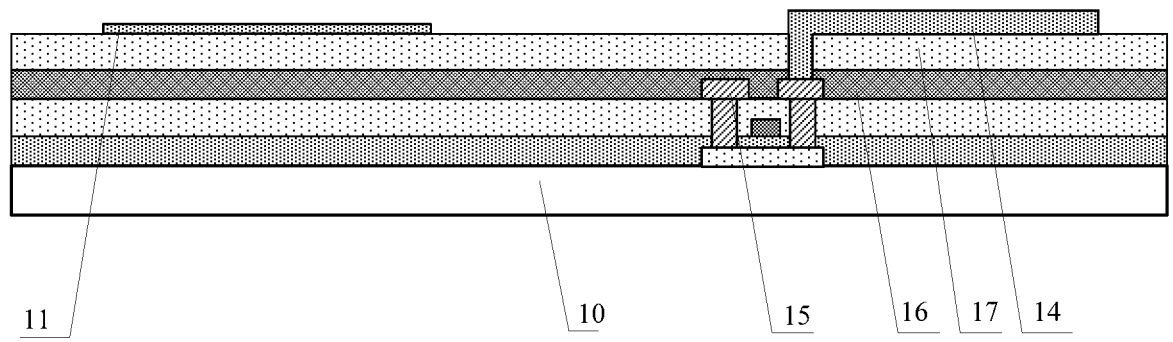
FIG. 6B is a second schematic diagram of a method for manufacturing an OLED display panel according to some arrangements of the present disclosure.

In 102, an anode 14 and a first lead 11 are formed on the planarization layer 17, as shown in FIG. 6B.

The anode 14 and the first lead 11 are formed by the same patterning process with the same material in order to simplify the process. The materials of the anode 14 and the first lead 11 may be transparent conductive materials, and may also be a metal, an alloy or a transparent conductive material. The anode 14 is disposed on the planarization layer 17 in the display area, and the first lead 11 is disposed on the planarization layer 17 of the non-display area.

Figure 6C:
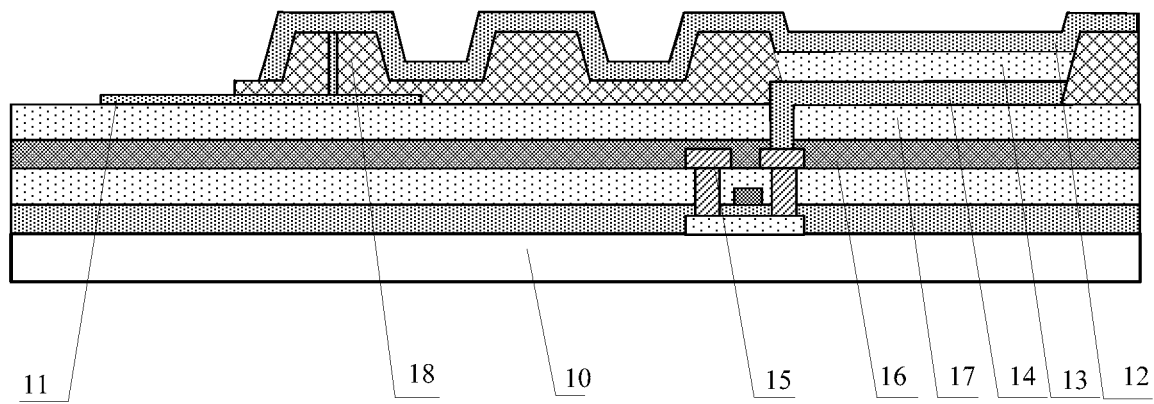
FIG. 6C is a third schematic diagram of a method for manufacturing an OLED display panel according to some arrangements of the present disclosure.

In 103, a pixel definition layer 18, a light emitting layer 13, and a cathode 12 are formed on the planarization layer 17 on which the anode 14 and the first lead 11 have been formed, as shown in FIG. 6C.

The cathode 12 is connected to the first lead 11 by the extension portion 121 through a via hole (as shown in FIG. 2), and an orthographic projection of the extension portion 121 on the base does not completely cover an orthographic projection of the first lead on the base.

Figure 6D:
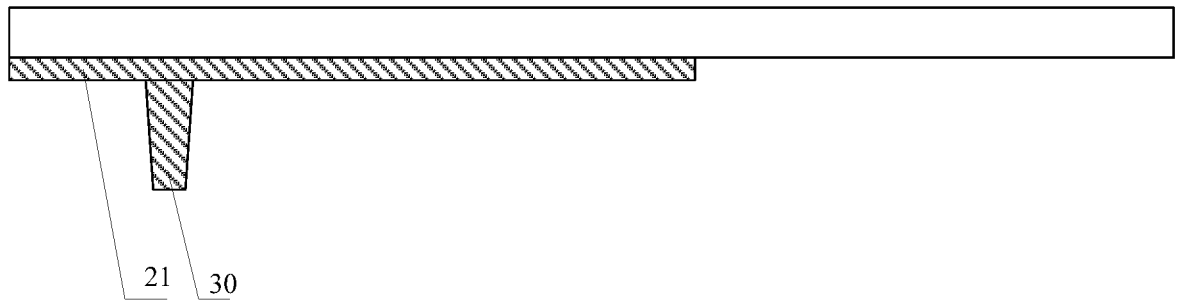
FIG. 6D is a fourth schematic diagram of a method for manufacturing an OLED display panel according to some arrangements of the present disclosure.

In 104, a second lead 21 connected to the peripheral circuit is disposed on the second substrate; and a first spacer 30 is disposed on a side of the second lead 21 adjacent to the first substrate, as shown in FIG. 6D.

The first spacer 30 may be electrically conductive, and the material of the first spacer 30 may be an alloy of one or more of chromium Cr, silver Ag, magnesium Mg, molybdenum Mo, aluminum Al, copper Cu, or doped with a polymer of the above metal particles or alloy particles. The shape of the first spacer 30 may be rectangular, trapezoidal or other shapes.

In some arrangements of the present disclosure, the first spacer is disposed on the second substrate as an example. It should be understood that the first spacer may also be disposed on the first substrate.

In 105, the first substrate and the second substrate are encapsulated with sealant 40, as shown in FIG. 2.

After the encapsulation, the first lead 11 is connected to the second lead 21 through the first spacer 30.

Based on the above inventive concept, the method for manufacturing the OLED display panel provided in some arrangements of the present disclosure is different from the method for manufacturing the OLED display panel provided by the above arrangements, in that the connection portion includes: a second spacer and an auxiliary electrode.

The 300 is to provide a connection portion on the second substrate, including: providing a second spacer on a side of the second lead adjacent to the first substrate; and providing an auxiliary electrode on a side of the second spacer adjacent to the first substrate. The auxiliary electrode covers the second lead.

There is a gap between an orthographic projection of the second spacer on the base and an orthographic projection of the extension portion on the base. It should be noted that in some arrangements of the present disclosure, the second spacer can separate the first substrate and the second substrate, and the auxiliary electrode can function to connect the first lead and the second lead.

Optionally, the material of the second spacer may be silicon oxide, silicon nitride or a polymer including silicon oxide or silicon nitride, and the like, and the material of the second spacer is not specifically limited in the arrangement of the present disclosure.

Optionally, the shape of the second spacer may be rectangular, trapezoidal or other shapes, which is not limited in the present disclosure.

Optionally, the material of the auxiliary electrode may be an alloy of one or more of chromium Cr, silver Ag, magnesium Mg, molybdenum Mo, aluminum Al, copper Cu, or doped with a polymer of the above metal particles or alloy particles, or a transparent conductive material, such as indium tin oxide, which is not limited in the present disclosure.

The arrangement of the present disclosure provides a method for manufacturing an OLED display panel, the OLED display panel includes: a first substrate and a second substrate disposed opposite to each other, and the method includes: providing a first lead connected to a cathode on the first substrate; providing a second lead connected to a peripheral circuit on the second substrate; providing a connection portion on the first substrate or the second substrate. The connection portion is configured to connect the first lead and the second lead; and encapsulating the first substrate and the second substrate to form a cell. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

The method for manufacturing the array substrate provided by the arrangement of the present disclosure will be further described below with reference to FIG. 6C, FIG. 7A, and FIG. 7B.

In 201, a thin film transistor 15, a passivation layer 16, and a planarization layer 17 are formed sequentially on the base 10, an anode 14 and a first lead 11 are formed on the planarization layer 17, and a pixel definition layer 18, a light emitting layer 13 and a cathode 12 are formed on the planarization layer 17 on which the anode 14 and the first lead 11 have been formed, as shown in FIG. 6C.

Figure 7A:
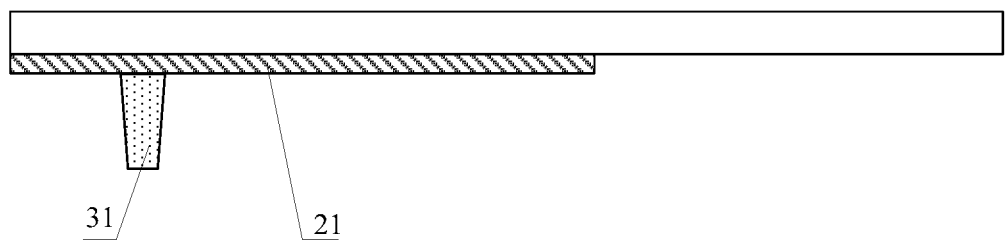
FIG. 7A is a first schematic diagram of a method for manufacturing an OLED display panel according to some arrangements of the present disclosure.

In 202, a second lead 21 connected to the peripheral circuit is provided on the second substrate; and a second spacer 31 is provided on a side of the second lead 21 adjacent to the first substrate, as shown in FIG. 7A.

The material of the second spacer 31 may be an alloy of one or more of chromium Cr, silver Ag, magnesium Mg, molybdenum Mo, aluminum Al, copper Cu, or a polymer doped with the above metal particles or alloy particles. The shape of the second spacers 31 may be rectangular, trapezoidal or other shapes.

Figure 7B:
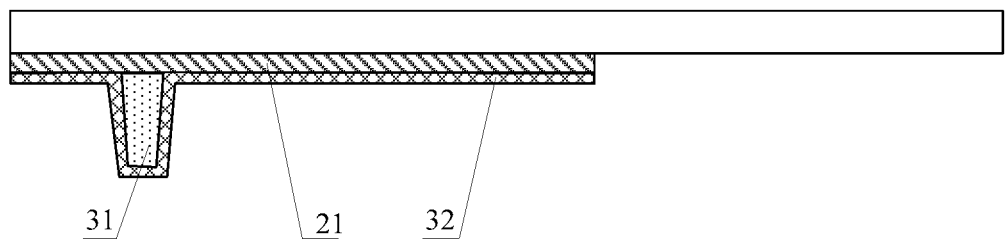
FIG. 7B is a second schematic diagram of a method for manufacturing an OLED display panel according to some arrangements of the present disclosure.

In 203, an auxiliary electrode 32 is disposed on a side of the second spacer 31 adjacent to the first substrate, and the auxiliary electrode 32 covers the second spacer 31 and the second lead 21, as shown in FIG. 7B.

Optionally, the material of the auxiliary electrode may be an alloy of one or more of chromium Cr, silver Ag, magnesium Mg, molybdenum Mo, aluminum Al, copper Cu, or doped with a polymer of the above metal particles or alloy particles, or a transparent conductive material, such as indium tin oxide, which is not limited in the present disclosure.

In 204, the first substrate and the second substrate are encapsulated with sealant 40 to form a cell, as shown in FIG. 3.

After the encapsulation, the first lead 11 may be connected to the second lead 21 through the auxiliary electrode 32.

Based on the inventive concept of the above arrangements, some arrangements of the present disclosure provide a method for manufacturing an OLED display panel. The OLED display panel includes: a first substrate and a second substrate disposed opposite to each other, and the method may include the following steps.

In 100, a first lead connected to a cathode is disposed on the first substrate.

The first substrate is an array substrate.

The 100 includes the following steps. It is to be understood that the first substrate includes a base, and the base includes a display area and a non-display area surrounding the display area. The first substrate further includes: a thin film transistor disposed on the base in the display area, a passivation layer and a planarization layer disposed on the base and covering the entire base, a pixel definition layer disposed on the planarization layer and an OLED device layer disposed on the base of the display area. The OLED device layer includes an anode, a light emitting layer and a cathode.

In 130, an interlayer insulating layer is provided on the base.

The 130 may include sequentially forming an active layer, a gate insulating layer, a gate electrode, and an interlayer insulating layer on the base. The gate insulating layer and the interlayer insulating layer cover the entire base.

In 140, a first lead is disposed on a side of the interlayer insulating layer adjacent to the second substrate.

As an example, the first lead may be disposed on the interlayer insulating layer in the non-display area. It should be noted that, in order to simplify the process, the first lead and the source-drain electrode are made of the same material by the same process.

In the arrangement of the present disclosure, after the 140, the method further includes: providing a passivation layer and a planarization layer on the base on which the first lead has be disposed. It should be noted that an orthographic projection of the passivation layer on the base is smaller than the base, an orthographic projection of the planarization layer on the base is smaller than the base, and the orthographic projection of the passivation layer on the base is larger than the orthographic projection of the planarization layer on the base. That is, the planarization layer, the passivation layer, and the substrate form a stepped shape, and thus the extension portion for connecting the cathode and the first lead is also in a stepped shape.

In 200, a second lead connected to a peripheral circuit is provided on the second substrate.

The second substrate is a color film substrate.

In 300, a connection portion is provided on the first substrate or the second substrate, and the connection portion is configured to connect the first lead and the second lead.

In some arrangements of the present disclosure, the connection portion includes: a first spacer that is electrically conductive.

Providing the connection portion on the first substrate may include: providing a first spacer on a side of the first lead adjacent to the second substrate.

Optionally, providing the connection portion on the second substrate includes: providing a first spacer on a side of the second lead adjacent to the first substrate.

It should be noted that in some arrangements of the present disclosure, the first spacer can not only separate the first substrate and the second substrate, but also function to connect the first lead and the second lead.

Optionally, the material of the first spacer may be an alloy of one or more of chromium Cr, silver Ag, magnesium Mg, molybdenum Mo, aluminum Al, copper Cu, or doped with a polymer of the above metal particles or alloy particles, which is not limited in the present disclosure.

Optionally, the shape of the first spacer may be rectangular, trapezoidal or of other shapes, and the present disclosure is not limited thereto.

In 400, the first substrate and the second substrate are encapsulated to form a cell.

The first substrate and the second substrate may be encapsulated with sealant to form a liquid crystal cell.

In addition, the method provided in the arrangement, after the 300, further includes: further providing a third spacer on a side of the second lead adjacent to the first substrate, and the third spacer is configured to connect the cathode and the second lead.

It should be noted that the first spacer is configured to connect the first lead and the second lead, and the third spacer is configured to connect the extension portion and the second lead. The first spacer and the second spacer are both disposed on a side of the second lead adjacent to the first substrate. There is a gap between an orthographic projection of the first spacer on the base and an orthographic projection of the third spacer on the base, and the first spacer and the third spacer are disposed in parallel. The number of the third spacers may be in plural, and the present disclosure is not limited thereto.

Optionally, the material of the third spacer may be an alloy of one or more of chromium Cr, silver Ag, magnesium Mg, molybdenum Mo, aluminum Al, copper Cu, or doped with the above metal particles or alloy particles, which is not limited in the present disclosure. It should be noted that the materials of the first spacer and the third spacer may be the same or different.

Optionally, the shape of the third spacer may be a rectangle, a trapezoid or other shapes, and the present disclosure is not limited thereto. It should be noted that the shapes of the first spacer and the third spacer may be the same or different, to which the present disclosure does not limit.

The arrangement of the present disclosure provides a method for manufacturing an OLED display panel, the OLED display panel includes: a first substrate and a second substrate disposed opposite to each other, and the method may include: providing a first lead connected to a cathode on the first substrate; providing a second lead connected to a peripheral circuit on the second substrate; providing a connection portion on the first substrate or the second substrate. The connection portion is configured to connect the first lead and the second lead; and encapsulating the first substrate and the second substrate to form a cell. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

The method for manufacturing an OLED display panel provided by the arrangement of the present disclosure will be further described below with reference to FIG. 8A to FIG. 8C, which are described as follows.

Figure 8A:
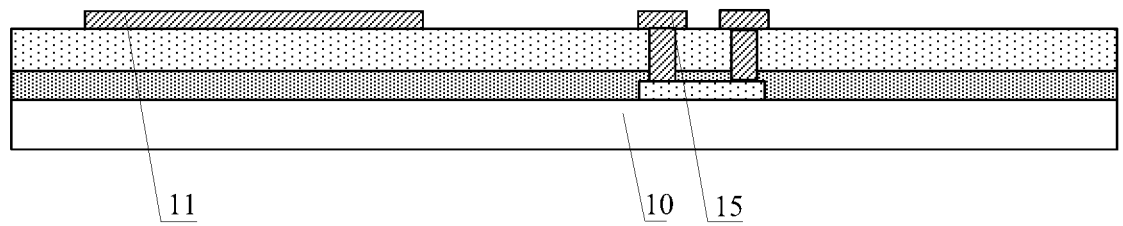
FIG. 8A is a first schematic diagram of a method for manufacturing an OLED display panel according to some arrangements of the present disclosure.

In 301, a thin film transistor 15 and a first lead 11 are formed on the base 10, as shown in FIG. 8A.

The thin film transistor 15 may be a bottom gate structure, and the first lead is disposed on the interlayer insulating layer in the non-display area, and is formed by the same process with the same material as the source-drain electrode. The material of the source-drain electrode and the first lead 11 may be a transparent conductive material, and may also be a metal or an alloy.

Figure 8B:
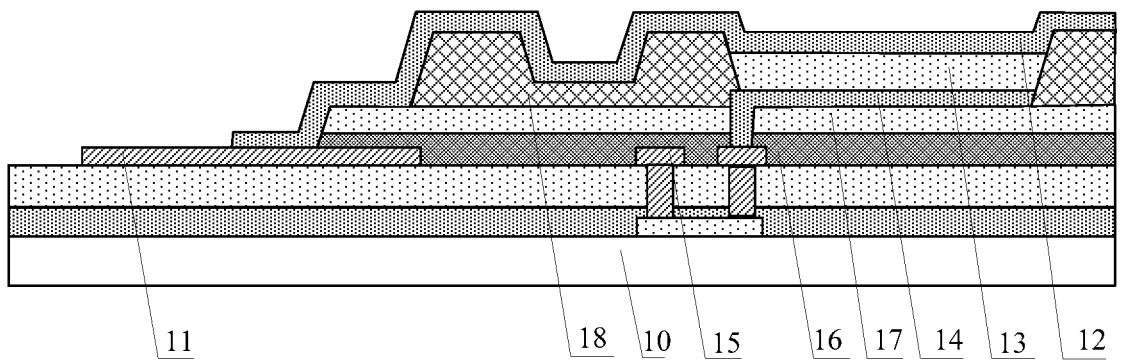
FIG. 8B is a second schematic diagram of a method for manufacturing an OLED display panel according to some arrangements of the present disclosure.

In 302, an interlayer insulating layer 19, a passivation layer 16, a planarization layer 17, an anode 14, a pixel definition layer 18, a light emitting layer 13, and a cathode 12 are formed sequentially on the base 10 on which the thin film transistor 15 and the first lead 11 have been formed, as shown in FIG. 8B.

In some arrangements of the present disclosure, the passivation layer 16 and the planarization layer 17 do not completely cover the base 10. An orthographic projection of the passivation layer on the base is larger than an orthographic projection of the planarization layer on the base, the orthographic projection of the passivation layer on the base is smaller than the base. In this case, the extension portion for connecting the cathode and the first lead is in a stepped shape.

Figure 8C:
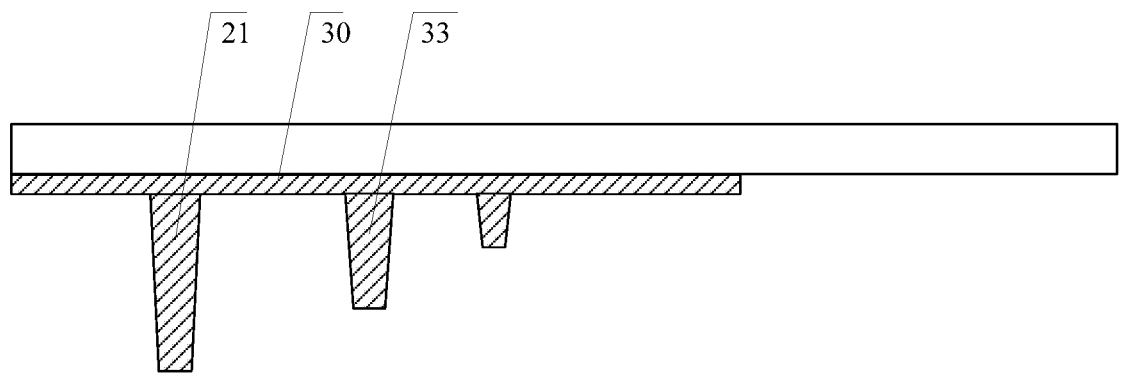
FIG. 8C is a third schematic diagram of a method for manufacturing an OLED display panel according to some arrangements of the present disclosure.

In 303, a second lead 21 connected to the peripheral circuit is disposed on the second substrate; a first spacer 30 and a third spacer 33 are disposed on a side of the second lead 21 adjacent to the first substrate, as shown in FIG. 8C.

The first spacers 31 and the third spacers 33 are both electrically conductive, the first lead 11 is connected to the second lead 21 through the first spacer 30, and the cathode 12 is connected to the second lead 21 through the third spacer 33.

The materials of the first spacer 30 and the third spacer 33 may be an alloy of one or more of chromium Cr, silver Ag, magnesium Mg, molybdenum Mo, aluminum Al, copper Cu, or the like, or doped with polymer of metal particles or alloy particles. The shapes of the first spacer 30 and the third spacer 33 may have may be rectangular, trapezoidal or of other shapes. It should be noted that the materials and shapes of the first spacer and the third spacer may be the same or different.

In 304, the first substrate and the second substrate are encapsulated with sealant 40 to form a cell, as shown in FIG. 4.

After the encapsulation, the first lead 11 may be connected to the second lead 21 through the second spacer 31.

Based on the inventive concept of the above arrangements, some arrangements of the present disclosure provide a method for manufacturing an OLED display panel is the same as the method for manufacturing an OLED display panel provided by the above arrangements, except that the connection portion includes a second spacer and an auxiliary electrode.

In the 300, a connection portion may be provided on the second substrate, including: providing a second spacer on a side of the second lead adjacent to the first substrate; and providing an auxiliary electrode on a side of the second spacer adjacent to the first substrate. The auxiliary electrode covers the second lead.

There is a gap between an orthographic projection of the second spacer on the base and an orthographic projection of the extension portion on the base. It should be noted that in some arrangements of the present disclosure, the second spacer can separate the first substrate and the second substrate, and the auxiliary electrode can function to connect the first lead and the second lead.

Optionally, the material of the second spacer may be silicon oxide, silicon nitride or a polymer including silicon oxide or silicon nitride, and the like, and the material of the second spacer is not specifically limited in the arrangement of the present disclosure.

Optionally, the shape of the second spacer may be rectangular, trapezoidal or other shapes, which is not limited in the present disclosure.

Optionally, the material of the auxiliary electrode may be an alloy of one or more of chromium Cr, silver Ag, magnesium Mg, molybdenum Mo, aluminum Al, copper Cu, or doped with a polymer of the above metal particles or alloy particles, or a transparent conductive material, such as indium tin oxide, which is not limited in the present disclosure.

In addition, after the 300, the method further includes: a fourth spacer is further disposed on a side of the second lead adjacent to the first substrate, and the fourth spacer is connected to the extension portion through the auxiliary electrode.

It should be noted that the second spacer and the fourth spacer are both disposed on a side of the second lead adjacent to the first substrate. There is a gap between an orthographic projection of the second spacer on the base and an orthographic projection of the fourth spacer on the base, and the second spacer and the fourth spacer are arranged in parallel. The number of the fourth spacers may be in plural, and the present disclosure is not limited thereto.

Optionally, the material of the fourth spacer may be silicon oxide, silicon nitride or doped with a polymer including silicon oxide or silicon nitride, and the like, and the material of the fourth spacer is not specifically limited in the arrangement of the present disclosure.

Optionally, the shape of the fourth spacer may be rectangular, trapezoidal or other shapes, and the present disclosure is not limited thereto. It should be noted that the shape of the fourth spacer may be the same as or different from the shape of the second spacer.

The arrangement of the present disclosure provides a method for manufacturing an OLED display panel, the OLED display panel includes: a first substrate and a second substrate disposed opposite to each other, and the method may include: providing a first lead connected to a cathode on the first substrate; providing a second lead connected to a peripheral circuit on the second substrate; providing a connection portion on the first substrate or the second substrate. The connection portion is configured to connect the first lead and the second lead; and encapsulating the first substrate and the second substrate to form a cell. In the technical solution of the present disclosure, the cathode is connected to the peripheral circuit through the first lead, the connection portion and the second lead, the first lead is disposed on the first substrate and the second lead is disposed on the second substrate, so that the first lead and the second lead will not be easily broken. It can avoid poor contact between the cathode and the peripheral circuit caused by the easy breakage of the lead in the related art, thus it can ensure good contact between the cathode and the peripheral circuit, and further realize excellent display effect of the OLED display panel.

Figure 9A:
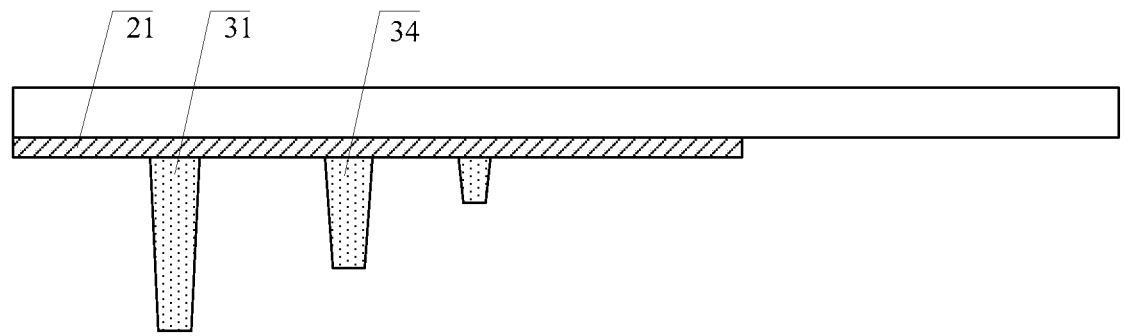
FIG. 9A is a first schematic diagram of a method for manufacturing an OLED display panel according to some arrangements of the present disclosure.
Figure 9B:
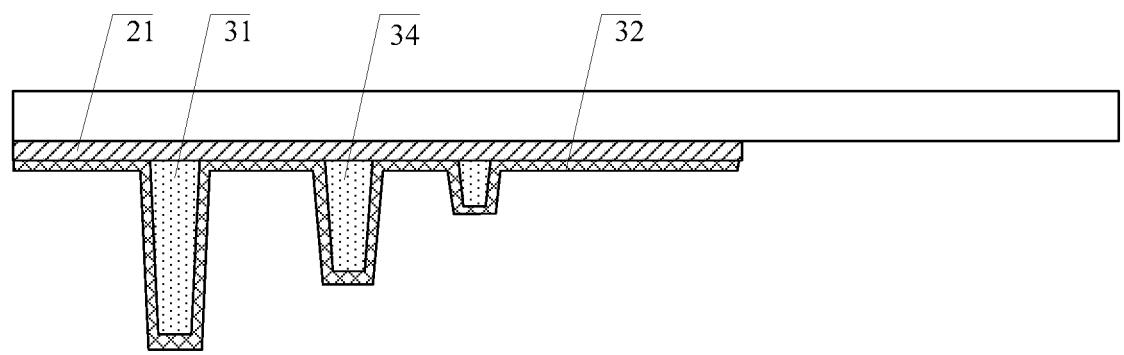
FIG. 9B is a second schematic diagram of a method for manufacturing an OLED display panel according to some arrangements of the present disclosure.

The method for manufacturing the OLED display panel provided by the arrangement of the present disclosure is further described below with reference to FIG. 8B, FIG. 9A, and FIG. 9B, which are described as follows.

In 401, a thin film transistor 15 and a first lead 11 are formed on the base 10, and an interlayer insulating layer 19, a passivation layer 16, a planarization layer 17, and an anode 14, a pixel definition layer 18, a light emitting layer 13 and a cathode 12 are sequentially formed on the base 10 on which the thin film transistor 15 and the first lead 11 have been formed, as shown in FIG. 8B.

The thin film transistor 15 may be a bottom gate structure, and the first lead is disposed on the interlayer insulating layer in the non-display area, and is formed by the same process with the same material as the source-drain electrode. The materials of the source-drain electrode and the first lead 11 may be transparent conductive material, and may also be a metal or an alloy. In some arrangements of the present disclosure, the passivation layer 16 and the planarization layer 17 do not completely cover the base 10, and an orthographic projection of the passivation layer on the base is larger than an orthographic projection of the planarization layer on the base, the orthographic projection of the passivation layer is smaller than the base. In this case, the extension portion for connecting the cathode and the first lead is in a stepped shape.

In 402, a second lead 21 connected to the peripheral circuit is provided on the second substrate; and a second spacer 31 and a fourth spacer 34 are provided on a side of the second lead 21 adjacent to the first substrate, as shown in FIG. 9 A.

The materials of the second spacer 31 and the fourth spacer 34 may be silicon oxide, silicon nitride or a polymer including silicon oxide or silicon nitride, and the shapes of the second spacer 31 and the fourth spacer 34 may be rectangular, trapezoidal or other shapes, and the present disclosure is not limited thereto. It should be noted that the material and shape of the fourth spacer may be the same as or different from the material and shape of the second spacer.

In 403, an auxiliary electrode 32 is provided on a side of the second spacer 31 and the fourth spacer 34 adjacent to the first substrate. The auxiliary electrode 32 covers the second lead 21, as shown in FIG. 9B.

The second spacer connects the first lead and the second lead through the auxiliary electrode, and the fourth spacer connects the cathode and the second lead through the auxiliary electrode.

In 404, the first substrate and the second substrate are encapsulated with sealant 40 to form a cell, as shown in FIG. 5.

After the encapsulation, the first lead 11 may be connected to the second lead 21 through the auxiliary electrode 32.

Although the arrangements in the present disclosure are as described above, but are merely to facilitate the understanding of the present disclosure, and are not intended to limit the present disclosure. Any modification and variation to in the form and details of the implementation made by those skilled in the art without departing from the spirit and scope of the present disclosure may fall in the scope defined by the appended claims.

What is claimed is:

1. An organic light emitting diode display panel having connection portion connecting organic light emitting diode to peripheral circuit, comprising:
   a first substrate and a second substrate disposed opposite to each other;
   wherein:
   the first substrate comprises a first lead connected to a cathode;
   the second substrate comprises a second lead connected to a peripheral circuit;
   the first lead is connected to the second lead through a connection portion;
   the first substrate further comprises an extension portion extending to a non-display area, and the cathode is connected to the first lead through the extension portion; and
   the first substrate further comprises a pixel definition layer, the pixel definition layer is disposed between the extension portion and the first lead, a via hole is provided in only the pixel definition layer, and the extension portion is connected to the first lead by a lead through only the via hole.

2. The organic light emitting diode display panel having connection portion connecting organic light emitting diode to peripheral circuit according to claim 1, wherein the first lead is disposed on a side of a planarization layer adjacent to the second substrate.

3. The organic light emitting diode display panel having connection portion connecting organic light emitting diode to peripheral circuit according to claim 2, wherein the connection portion comprises a first spacer that is electrically conductive; and
   wherein the first spacer is disposed between the first lead and the second lead.

4. The organic light emitting diode display panel having connection portion connecting organic light emitting diode to peripheral circuit according to claim 2, wherein the connection portion comprises a second spacer and an auxiliary electrode; and
   wherein the second spacer is disposed on a side of the first lead adjacent to the second substrate, and the auxiliary electrode is disposed between the second spacer and the first lead and covers the second spacer and the second lead.

5. The organic light emitting diode display panel having connection portion connecting organic light emitting diode to peripheral circuit according to claim 1, wherein the first lead is disposed on a side of an interlayer insulating layer adjacent to the second substrate.

6. The organic light emitting diode display panel having connection portion connecting organic light emitting diode to peripheral circuit according to claim 5, wherein the connection portion comprises a first spacer that is electrically conductive;

and wherein the first spacer is disposed between the first lead and the second lead.

7. The organic light emitting diode display panel having connection portion connecting organic light emitting diode to peripheral circuit according to claim 5, wherein the connection portion comprises a second spacer and an auxiliary electrode; and wherein the second spacer is disposed on a side of the first lead adjacent to the second substrate, and the auxiliary electrode is disposed between the second spacer and the first lead and covers the second spacer and the second lead.

8. A method for manufacturing an organic light emitting diode display panel having connection portion connecting organic light emitting diode to peripheral circuit, wherein the organic light emitting diode display panel having connection portion connecting organic light emitting diode to peripheral circuit comprises a first substrate and a second substrate disposed opposite to each other, and the method comprises:

providing on the first substrate a first lead connected to a cathode;

providing on the second substrate a second lead connected to a peripheral circuit;

providing a connection portion on the first substrate or the second substrate, the connection portion for connecting the first lead and the second lead; and encapsulating the first substrate and the second substrate to form a cell,.

wherein the first substrate comprises an extension portion extending to a non-display area, and the cathode is connected to the first lead through the extension portion; and the first substrate further comprises a pixel definition layer, the pixel definition layer is disposed between the extension portion and the first lead, a via hole is provided in only the pixel definition layer, and the extension portion is connected to the first lead by a lead through only the via hole.

9. The method according to claim 8, wherein providing on the first substrate a first lead connected to a cathode comprises:

providing a planarization layer on a base; and the first lead is disposed on a side of the planarization layer adjacent to the second substrate.

10. The method according to claim 9, wherein the connection portion comprises a first spacer that is electrically conductive, and providing a connection portion on the first substrate comprises: providing the first spacer on a side of the first lead adjacent to the second substrate; or providing a connection portion on the second substrate comprises: providing the first spacer on a side of the second lead adjacent to the first substrate.

11. The method according to claim 9, wherein the connection portion comprises a second spacer and an auxiliary electrode, and providing a connection portion on the second substrate comprises:

providing a second spacer on a side of the second lead adjacent to the first substrate; and providing the auxiliary electrode on a side of the second spacer adjacent to the first substrate, wherein the auxiliary electrode covers the second spacer and the second lead.

12. The method according to claim 8, wherein providing on the first substrate a first lead connected to a cathode comprises: providing an interlayer insulating layer on a base, wherein the first lead is disposed on a side of the interlayer insulating layer adjacent to the second substrate.

13. The method according to claim 12, wherein the connection portion comprises: a first spacer that is electrically conductive, and providing a connection portion on the first substrate comprises: providing the first spacer on a side of the first lead adjacent to the second substrate; or, providing a connection portion on the second substrate comprises: providing the first spacer on a side of the second lead adjacent to the first substrate.

* * * * *